(12) United States Patent
Hof et al.

(10) Patent No.: US 8,253,947 B2
(45) Date of Patent: Aug. 28, 2012

(54) DEVICE AND METHOD FOR MEASURING LITHOGRAPHY MASKS

(75) Inventors: Albrecht Hof, Aalen (DE); Günter Maul, Aalen (DE); Dietmar Neugebauer, Aalen (DE); Armin Bich, Aalen (DE); Monika Frey, Steinheim (DE); Wolfgang Scherm, Aalen (DE); Stefan Otto, Oberkochen (DE); Rainer Maul, Huttlingen (DE); Helmut Krause, Aalen (DE)

(73) Assignee: Carl Zeiss SMS GmbH, Jena (DE)

( * ) Notice: Subject to any disclaimer, the term of this patent is extended or adjusted under 35 U.S.C. 154(b) by 517 days.

(21) Appl. No.: 12/518,968

(22) PCT Filed: Nov. 6, 2007

(86) PCT No.: PCT/EP2007/009600
§ 371 (c)(1),
(2), (4) Date: Dec. 16, 2009

(87) PCT Pub. No.: WO2008/071268
PCT Pub. Date: Jun. 19, 2008

(65) Prior Publication Data
US 2011/0205549 A1    Aug. 25, 2011

Related U.S. Application Data

(60) Provisional application No. 60/870,315, filed on Dec. 15, 2006.

(30) Foreign Application Priority Data

Dec. 15, 2006 (DE) .......................... 10 2006 059 432

(51) Int. Cl.
*G01B 11/02* (2006.01)
*G01B 11/14* (2006.01)
(52) U.S. Cl. ........................................ 356/509; 356/614
(58) Field of Classification Search .................. 356/500, 356/580, 509, 510, 614
See application file for complete search history.

(56) References Cited

U.S. PATENT DOCUMENTS 5,917,580 A    6/1999   Ebinuma et al.
(Continued)

FOREIGN PATENT DOCUMENTS
DE    198 19 492    11/1999
(Continued)

OTHER PUBLICATIONS

International Search Report for International Application No. PCT/EP2007/009600 dated Feb. 29, 2008.

*Primary Examiner* — Michael A Lyons
(74) *Attorney, Agent, or Firm* — Fish & Richardson P.C.

(57) ABSTRACT

A device for measuring lithography masks is provided, comprising
a reticle carrier for the lithography mask to be measured,
a measurement objective for reproducing on a detector a section of said lithography mask held by said reticle carrier,
a measurement module for measuring the position of said reticle carrier relative to said measurement objective,
and a correction module by means of which said reticle carrier can be moved in order to bring it into a predetermined position relative to said measurement objective,
wherein said measurement objective and said measurement module are fastened directly to an instrument carrier in a locally fixed manner.

17 Claims, 3 Drawing Sheets

U.S. PATENT DOCUMENTS

| | | | |
|---|---|---|---|
| 6,020,964 A * | 2/2000 | Loopstra et al. | 356/500 |
| 6,323,953 B1 | 11/2001 | Blaesing-Bangert et al. | |
| 6,700,667 B2 * | 3/2004 | Nishi | 356/509 |
| 7,450,246 B2 * | 11/2008 | Boesser et al. | 356/500 |
| 2007/0139635 A1 * | 6/2007 | Binnard et al. | 355/68 |
| 2008/0068568 A1 * | 3/2008 | Ebihara et al. | 355/30 |

FOREIGN PATENT DOCUMENTS

EP     1 341 044     9/2003

\* cited by examiner

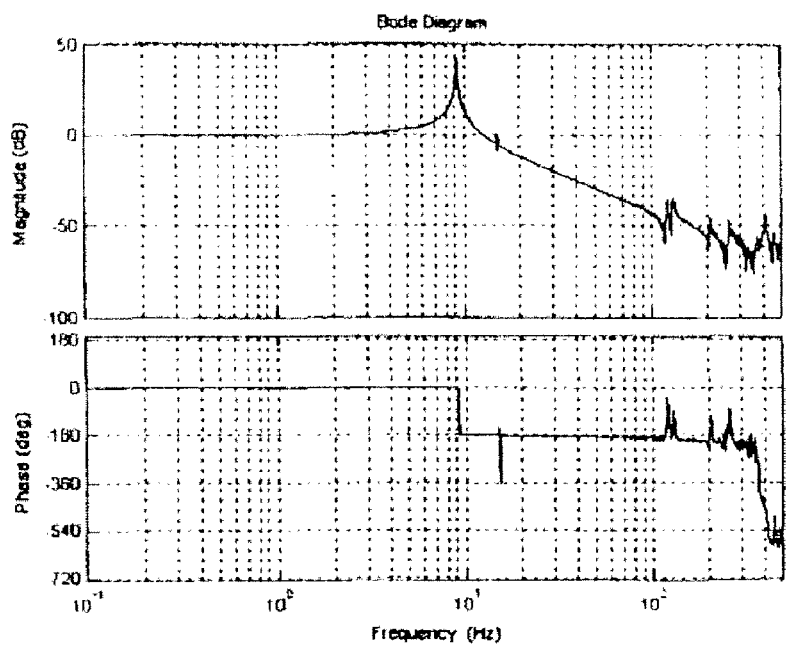
Fig. 5a
Fig. 5b
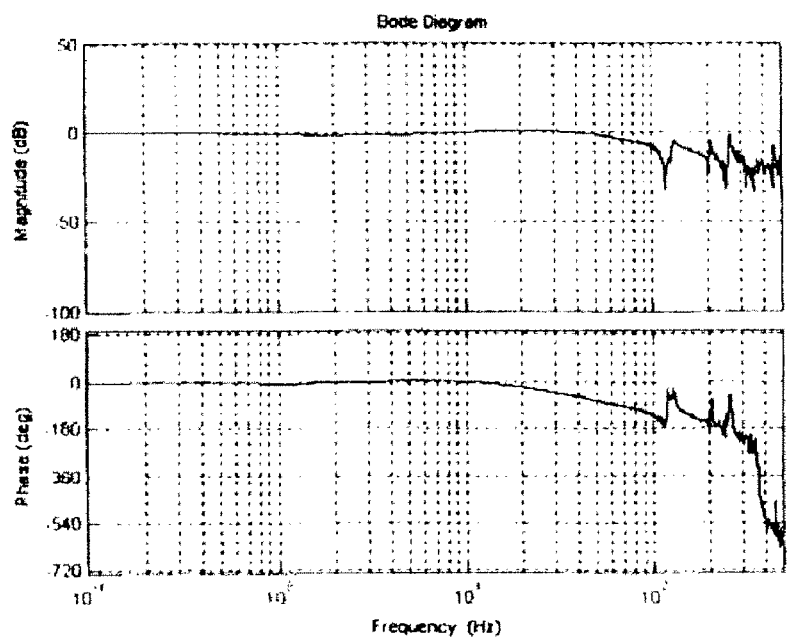
Fig. 6a
Fig. 6b

DEVICE AND METHOD FOR MEASURING LITHOGRAPHY MASKS

CROSS REFERENCE TO RELATED APPLICATION

This application is the National Stage International Application No. PCT/EP2007/009600, filed on Nov. 6, 2007, which claims priority to German Patent Application Serial No. 10 2006 059 432.0, filed on Dec. 15, 2006 and U.S. Provisional Application Ser. No. 60/870,315, filed on Dec. 15, 2006. The contents of these applications are hereby incorporated by reference in their entireties.

TECHNICAL FIELD

The present invention is directed to a device and a method for measuring lithography masks.

BACKGROUND

Due to the increasingly small structure widths realized in the production of semiconductor components, it is necessary for the devices used to inspect lithography masks to have increasingly high resolution. In this context, the reticle carrier holding the lithography mask must be positionable with increasingly high accuracy in relation to the measurement objective of the device for measuring lithography masks. Thus, for a wavelength of 193 nm, for example, devices for measuring lithography masks should have a positioning accuracy such that the cumulative root mean square deviation between the lithography mask to be measured and the measurement objective, in the plane of the lithography mask, does not exceed 0.3 nm at frequencies of 1 to 10 Hz.

SUMMARY

Proceeding from this, it is an object of the invention to provide a device for measuring lithography masks with which the aforesaid positioning accuracy can be achieved. A corresponding method for measuring lithography masks is also to be provided.

The object is achieved by means of a device for measuring lithography masks, comprising a reticle carrier for the lithography mask to be measured, a measurement objective for reproducing on a detector a section of the lithography mask held by the reticle carrier, a measurement module for measuring the position of the reticle carrier relative to the measurement objective, and a correction module by means of which the reticle carrier can be moved in order to bring it into a predetermined position relative to the measurement objective, wherein the measurement objective and the measurement module are fastened directly to an instrument carrier in a locally fixed manner.

The direct fixation of both the measurement objective and the measurement module advantageously achieves the effect of eliminating relative movement between the measurement objective and the measurement module. This makes it possible to achieve the desired positioning accuracy, since the position of the reticle carrier relative to the measurement objective can be measured with the required accuracy by means of the measurement module and then adjusted and held (for the necessary exposure time) by means of the correction module.

In a development of the measuring device, the correction module is not locally fixed directly to the instrument carrier. It is thereby possible for the measurement module, which has to move the reticle carrier mechanically, not to have a negative effect on the measurement accuracy, since only the measurement module and the measurement objective are fastened directly to the instrument carrier.

The instrument carrier is, in particular, rigidly implemented. This is understood here to mean in particular that the first eigenmode of mechanical vibration occurs at $\geq 100$ Hz.

Furthermore, the instrument carrier is athermally implemented. This is understood here to mean in particular that the thermal expansion coefficient for the relevant operating temperature (ambient temperature, for example) $\leq 0.1 \times 10^{-6}$/K.

This can be achieved, for example, by making the instrument carrier from a glass ceramic material. For example, the material supplied by the Schott company under the tradename Zerodur can be used. A suitable Invar alloy can also be used.

It is further possible for the instrument carrier to be implemented in one piece. In particular, it is made from a single material. The desired mechanical rigidity and the desired athermal property can be realized in this way.

The measurement module can, in particular, measure the position of the reticle carrier interferometrically. To this end, it is advantageous for at least one mirror to be fastened to the reticle carrier and a mirror also to be fastened to the instrument carrier, or for portions of the reticle carrier and of the instrument carrier to be implemented as mirrors.

The measurement module can, in particular, measure the position of the reticle carrier relative to the instrument carrier (and thus also relative to the measurement objective) in all six mutually independent degrees of freedom. There may be, for example, three independent translational degrees of freedom and three independent rotational degrees of freedom.

In the measuring device according to the invention, the correction module is able to adjust the position of the reticle carrier in all six mutually independent degrees of freedom.

The instrument carrier can be mounted in a statically determinate manner. This increases the measurement accuracy.

The reticle carrier can, in particular, comprise an alternate frame that serves to receive the lithography mask and is mounted in the reticle carrier in a statically determinate manner. It is thus easily possible to measure a plurality of lithography masks relatively quickly in succession.

The alternate frame can, in particular, be inserted in the reticle carrier in such a way that it is able to rotate in different angular positions about an axis and can be displaced by a few millimeters in at least one direction in a plane perpendicular to the axis. It is thereby possible to calibrate the device easily.

The reticle carrier is preferably configured such that no shift occurs in the center of gravity of the reticle carrier, regardless of the angular position and regardless of the displacement of the alternate frame in the reticle carrier.

The correction module can have a coarse drive and a fine drive for each degree of freedom.

The correction module and the measurement module are, in particular, connected to form a feedback control loop, such that highly accurate positioning of the reticle carrier is possible.

At least one coarse drive can be realized in the form of rotary motors with spindle drives. For the fine drive of at least one degree of freedom, piezoactuators or, alternatively, Lorenz actuators can be employed.

A Cartesian coordinate system can be defined relative to the reticle carrier, with the surface of the lithography mask to be measured lying parallel to the xy plane. The z axis runs vertical thereto. Rotations about these axes thus are denoted hereinbelow as Rx, Ry and Rz.

In particular, the fine drives for the degrees of freedom z, Rx and Ry can be realized by piezoactuators. The fine drives for the degrees of freedom x, y and Rz can be implemented as Lorenz actuators.

The coarse drives in the degrees of freedom x, y, z, Rx and Ry can be embodied by rotary motors with spindle drives.

The mirror surfaces for interferometric measurement of the measurement module for the degrees of freedom x, y and Rz can be disposed directly on the (movable) reticle carrier. These mirror surfaces are preferably end mirrors of the particular measurement arm of the interferometric measurement system.

For measurement within the degrees of freedom z, Rx, Ry, the measurement beams are deflected 90° by two mirrors disposed in the x and y directions on the reticle carrier and are guided to a plane mirror that is fastened to the instrument carrier and is an end mirror of the particular measuring arm of the interferometric measurement system.

The device can, in particular, be implemented in a housing that is sealed off from the environment. The housing can have a plurality of mutually separated subsections. The separation can be realized by means of partitions and gap seals. The housing can, in particular, be implemented in such a way that conditioned super-clean air or inert gas, for example $N_2$ (purity approximately N6 or NG) flows from the bottom section, within which the reticle carrier is moved, through gap seals to the outside.

The gap seals can have a distance between adjacent plates of 0.1 mm to 1 mm. The flow-through length can be a few mm to a few cm.

The device can be implemented in such a way that it is or comes to be evacuated in order to perform the measurements.

The device further comprises a control module that effects the necessary control of the device. In particular, the measurement data and, where applicable, data from the detector are also fed to the control module.

These data can be analyzed in the control module or in a separate analysis module.

The device according to the invention can be developed further as recited in the dependent device claims.

Further provided is a method for measuring lithography masks, in which a reticle carrier with a lithography mask to be measured is brought into a predetermined position relative to a measurement objective, the position of the reticle carrier relative to the measurement objective is measured by means of a measurement module, and in this position a section of the reticle carrier is reproduced on a detector by means of the measurement objective, wherein the measurement objective and the measurement module are fastened directly to an instrument carrier in a locally fixed manner.

The invention is explained exemplarily below in greater detail with reference to the figures.

DESCRIPTION OF THE DRAWINGS

FIG. 5a is an amplitude response of a measured transfer function of the reticle carrier 1 of FIG. 1 in the x direction, without feedback control;

FIG. 5b is a phase response for the transfer function of FIG. 5a;

FIG. 6a is an amplitude response of a measured transfer function of the reticle carrier 1 of FIG. 1 in the x direction, with feedback control, and FIG. 6b is a phase response for the transfer function of FIG. 6a.

DETAILED DESCRIPTION

Figure 1:
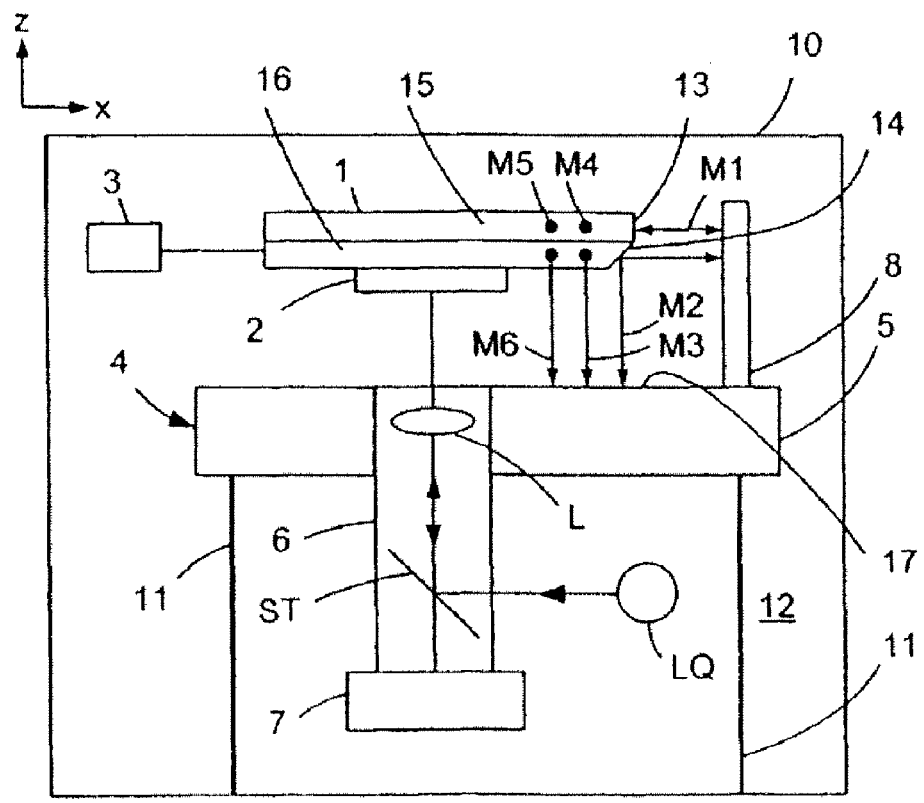
FIG. 1 is a schematic view of the device for measuring lithography masks.

In the embodiment illustrated in FIG. 1, the device for measuring lithography masks includes a reticle carrier 1 for receiving the lithography mask 2 to be measured. The reticle carrier 1 can be moved by means of a correction module 3. The movements that are possible in this case are translational movements in all three spatial directions (the x, y and z directions) of a Cartesian coordinate system (the plane of the drawing is in the xz plane, and the y direction extends perpendicular to the plane of the drawing) and rotational movements about each axis of the coordinate system, a rotation about the x axis being denoted by Rx, a rotation about the y axis by Ry, and a rotation about the z axis by Rz.

The device shown in FIG. 1 further includes a measurement platform 4, which includes an instrument carrier 5 to which a measurement objective 6 is directly fastened in a locally fixed manner. Fastened to the measurement objective 6, in turn, is a capture device or a detector 7 (here in the form of a CCD camera).

The necessary illuminating radiation source LQ is illustrated schematically here, vertical illumination being used in this case. The illuminating radiation source LQ can, in particular, include a laser source emitting pulsed laser radiation with a wavelength of 193 nm. Also depicted schematically are a beam splitter ST and a lens L, standing in for the optic of the measurement objective 6. The illumination can also, of course, be implemented as transillumination.

The measurement platform 4 further comprises a measurement module 8, which is fastened directly to the instrument carrier 5 in a locally fixed manner. The measurement module 8 is here implemented as an interferometric measurement module, with which the position of the reticle carrier 1 and thus of the lithography mask 2 in relation to the instrument carrier 5 and thus to the measurement objective 6 can be determined for all six degrees of freedom of movement (translational movements in the x, y and z directions, rotational movements about the x, y and z axes) with extremely high accuracy.

The following description relates to a calibration reticle, although the inventive method and the inventive device can also, of course, be used with other lithography masks.

Figure 2:
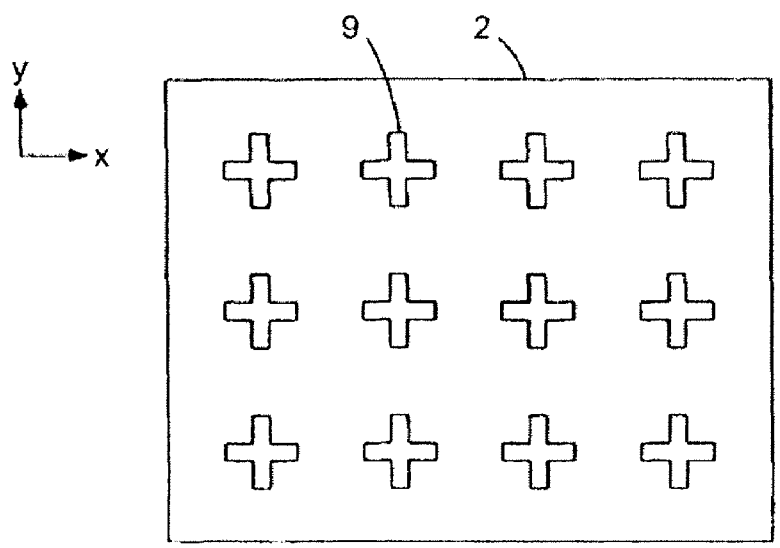
FIG. 2 is a schematic plan view of a lithography mask to be measured.
Figure 3:
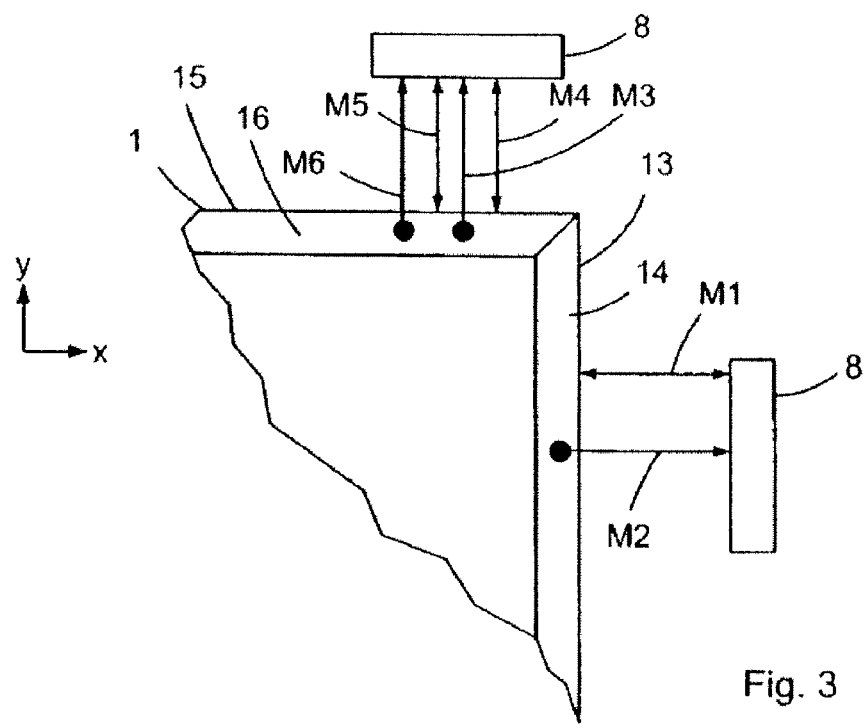
FIG. 3 is an enlarged detail view from below of the reticle carrier 1 of FIG. 1.

FIG. 2 is a plan view of the lithography mask 2 (calibration reticle) to be measured, depicted schematically and not to scale. The mask has a rectangular shape here; the longer side can be about 150 mm and the shorter side about 100 mm long. A multiplicity of marks 9, here essentially in the shape of a plus sign, are provided on the lithography mask 2. The marks are ordinarily 2-10 µm in size and are located between the structures (not shown) of the mask 2 that are needed to make exposures. The mask 2 can have approximately 200-300 such marks. In this case, the average distance between two marks is then 5-8 mm.

The measuring device is intended to position the individual marks 9 and thus the lithography mask 2 in relation to the measurement objective 6 or to the measurement platform 4 with such accuracy that the root mean square deviation between the lithography mask 2 and the measurement objective 6 (or between the reticle carrier 1 and the instrument carrier 5) in the xy direction is no greater than 0.3 nm.

To be able to achieve this required accuracy reliably over the entire lithography mask 2, the device comprises the measurement platform 4, on which both the measurement objective 6 and the measurement module 8 are locally fixed directly to the instrument carrier 5. The correction module 3 is not a component of the measurement platform 4, and thus, by the same token, is not fastened directly to the instrument carrier 5.

The instrument carrier 5 itself is implemented as a glass ceramic whose expansion coefficient at a predetermined temperature (room temperature, for example) is nominally zero. The instrument carrier 5 is also implemented as particularly rigid. This is understood here to mean in particular that the first eigenmode of a mechanical vibration of the instrument carrier occurs at $\geq 100$ Hz.

As can further be seen in FIG. 1, a housing 10 is provided, in which the measurement platform 4 is mounted in a statically determinate manner. The statically determinate mounting 11 is particularly implemented in such a way that external forces acting on the housing 10 do not cause geometrical changes of any kind in the measurement platform 4.

The housing 10 further provides a measurement chamber 12 whose atmosphere is extremely precisely defined and controlled. For instance, the temperature can be adjusted to within 0.1 mK. The humidity in the measurement chamber and other parameters are also exactly controlled. In particular, the measurement chamber 12 can be filled with carrier gas or it can be evacuated.

For interferometric measurement of the position of the reticle carrier 1 relative to the instrument carrier 5 by means of the measurement module 8, the reticle carrier 1 has on its first-side a first mirror 13 and a second mirror 14 that is tilted 45°, and on its second side a third mirror 15 and a fourth mirror 16 that is tilted 45°. A fifth mirror 17 is provided on the top side of the instrument carrier 5. The following description of the measurement module 8 refers only to the necessary measurement-beam paths for interferometric measurement. The optical elements of the measurement module 8, such as, for example, lasers, beam splitters, etc., are not described. A person skilled in the art will be able, without further instruction, to arrange these elements suitably so as to produce the measurement-beam paths described below. Measurement-beam paths M1, M2, M3, M4, M5, M6 are also indicated schematically. Measurement-beam path M1 is used for position determination in the x direction. Measurement-beam path M1, together with measurement-beam path M2, is used to determine the position in the z direction.

M4, M5 are used to determine y, Rz, and M2, M3, M6 to determine z, Rx, Ry, after the measurements in the x and y directions are subtracted accordingly.

Measurement-beam paths M4, M5 strike the third mirror 15. These measurement-beam paths are used to analyze the rotation about the y and x axes.

The correction module 3 and the reticle carrier 1 are here implemented in such a way that the range of movement in the x and y directions is ±80 mm in each case. The range of movement in the z direction is approximately ±2 mm. The possible rotational movement about Rx, Ry and Rz is approximately ±1.5 mrad in each case.

Figure 4:
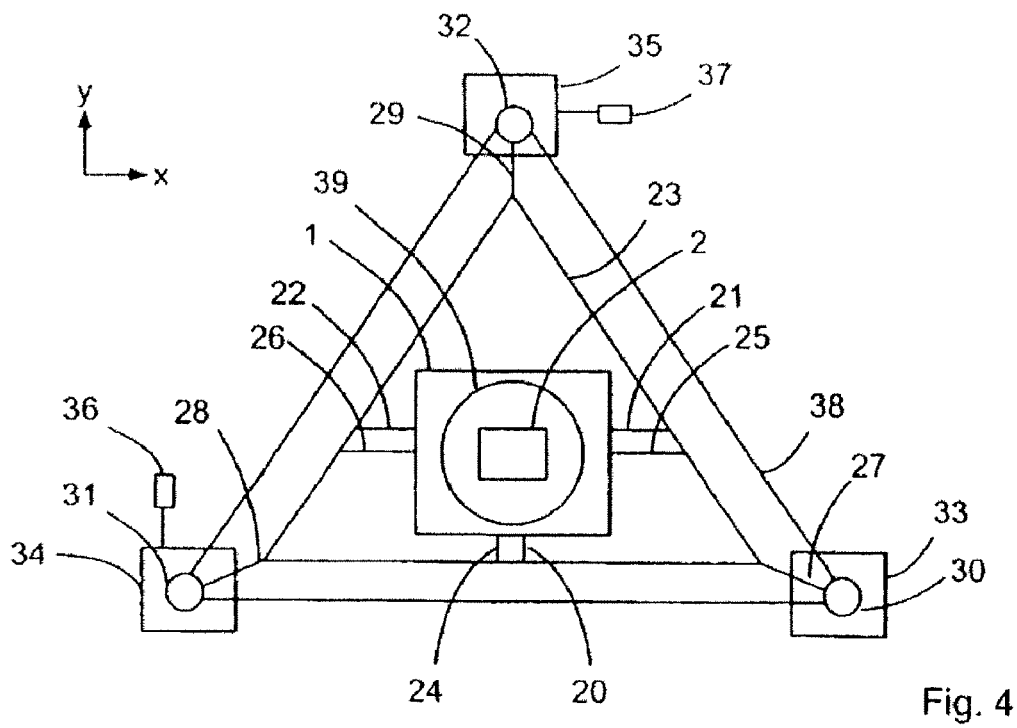
FIG. 4 is a schematic representation of the correction module of FIG. 1.

FIG. 4 schematically depicts an embodiment of the correction module 3. The reticle carrier 1 is connected to a central frame 23 via three schematically illustrated solid-state joints 20, 21, 22 having the degrees of freedom x, y, Rz. Provided in parallel with each solid-state joint 20, 21 and 22 is a voice coil motor 24, 25, 26, by means of which tangential forces can be applied to the reticle carrier 1. The three degrees of freedom x, y and Rz can be controlled by suitable interconnection and driving of the voice coils. The solid-state joints 20-22 connected in parallel with the voice coil motors 24-26 serve to reduce the 1 g load, a resonance simultaneously being induced in the x, y and Rz directions. Since a mass-spring system has an inhibiting effect on the disturbance at frequencies that are well above resonance, the resonant frequency is kept as low as possible in this case. The resonance should not be placed in the 1 Hz range, however, since in that range, particularly large disturbances can be expected from an air-spring mounting of the mounting 11 with respect to the housing 10 and/or an air-spring mounting of the housing 10 with respect to the environment. The springs were therefore designed so that the resonance frequency $f_{xres}=f_{yres}\approx 9$ Hz and $f_{Rzres}\approx 11$ Hz.

The central frame 23 is connected at each of its three corners, via a cardan solid-state joint 27, 28, 29, to the head point of the z drive 30, 31, 32 provided at that corner. Each z drive has a series-connected spindle-and-piezo drive, so the degrees of freedom z, Rx and Ry can be adjusted by means of the z drives 30-32. No resonances or eigenmodes should occur with respect to the z drives 30-32 up to at least 80 Hz. The cardan solid-state joint 27-30 serves to decouple disruptive forces from the piezo drives, since, despite their high sensitivity to shear forces, these drives are used for tilting in Rx and Ry.

Each of the z drives 30-32 sits on an xy sled 33, 34, 35, all of which are displaceable in the x and y directions. Sled 34 can be displaced in the y direction under the control of a y spindle drive 36. Sled 35 can be displaced in the x direction under the control of an x spindle drive 37. Sled 33 is passive and is carried along. Sleds 33-35 are connected to one another by an outer frame 38, so as to eliminate the degree of freedom in the Rz direction that is unwanted in this case.

The reticle carrier 1 further comprises an alternate frame 39, which carries the lithography mask 2 and is interchangeable with the reticle carrier 1.

The required positioning accuracy of the reticle carrier 1 with respect to the instrument carrier 5 is arrived at here by means of a multi-stage drive scheme, in which a movement with a long travel range and low accuracy has superimposed on it a movement with a short travel range and high accuracy. The long travel range is obtain by means of the described spindle drives 36, 37. For fine adjustment, with nm resolution, the voice coil motors (or Lorenz actuators) are used for the x and y directions and the degree of freedom Rz. For the z direction and the degrees of freedom Rx and Ry, the piezo drives of z drives 30-32 are used.

The position of the reticle carrier 1 is measured by the measurement module 8 directly between the instrument carrier 5 and the reticle carrier 1, so that no measurements of the different drive stages are concatenated together and at least small errors can thus be tolerated in the drive mechanism.

Since, in the device for measuring lithography masks, the lithography mask 2 must also naturally stand still and not vibrate during exposure, the dynamic characteristics must also be taken into account. With image acquisition times of typically 30 ms, it is therefore necessary for the device to have an effective vibration amplitude of no more than about 1 nm up to approximately 30 Hz. At higher frequencies, no distinct or excited vibrations should occur.

It follows that the first eigenmode of function-determining subassemblies must be above 30 Hz. Since movements of the correction module 3 are also included in the closed feedback control loop, the requirement is interpreted here as being that the effective value of the parasitic movements must be $\leq 1$ nm to 30 Hz and $\leq 0.3$ nm to 10 Hz. For a controller to be able to suppress interference to that frequency, the controller bandwidth also must be at least on this order of magnitude. Thus, for all elements of the device that are under the control of the feedback control loop, the first eigenmode must not, insofar as possible, be situated below 100 Hz. This does not apply, however, to modes that are set up this way by design and are factored into the control engineering.

The correction module 3 should, insofar as possible, function in such a way that correction signals for low frequencies are converted with amplification of 1 with no time delay, and interference thus is completely suppressed. Illustrated by way of example in FIG. 5a is a measured transfer function of the reticle carrier 1 in the x direction without feedback control, and in FIG. 5b, the associated phase curve. The amplitude-frequency response runs parallel to the 0 dB line only up to about 9 Hz. The amplification could be set to 1 by suitable choice of the amplification factor. At about 9 Hz a resonance builds up, formed by the system consisting of the cardan solid-state joints (27-29) and the mirrors (13-17). If the non-feedback-controlled reticle carrier 1 is moved in the x or y direction, therefore, a vibration of f≈9 Hz is easily excited. Since there is no substantial attenuation in the system, the mirror immediately begins to vibrate in response to the smallest disturbance.

If the reticle carrier 1 were to be moved nonetheless, it would be necessary to execute very slow movements to avoid introducing any movements with frequency components in the critical range. It is also apparent from the curve that introduced movements that are in the frequency range considerably above resonance are executed by the reticle carrier with a much smaller amplitude. This is very desirable for the application, since it can be assumed from this that high-frequency interference is attenuated due to the filtering action of the mounting.

The feedback control system has the effect here of improving the controlled characteristics of the mechanics to such an extent that the desired positioning accuracies (static and dynamic) are attained; for example, the natural resonances are combated. Owing to the described design of the correction module, the degrees of freedom x, y, Rz and z, Rx, Ry can be separated even with the feedback control scheme. This is possible in particular because care was taken in the design of the correction module 3 to ensure that movements of the piezo actuators of the z drives 30-32 have no effect on the x, y, Rz directions and, conversely, that the voice coil drives 24-26 do not interfere with the degrees of freedom z, Rx, Ry. It is especially important that these interactions not occur even with movements well into the 100 Hz range. The transfer functions show resonances at higher frequencies, especially for z, Rx, Ry, that otherwise would be excited by the feedback control activity.

For the degrees of freedom x, y, Rz, therefore, a MIMO (multiple-input multiple-output) feedback controller is designed and used in this case. From nine individual measurements that serve to measure the interactions of all the actuators in all directions, a 3×3 controller matrix is developed that takes all the couplings into account and produces the desired constant transfer behavior for the degrees of freedom x, y and Rz, to a bandwidth of around 30 Hz. The result, in the x direction, for the reticle carrier 1 is represented in FIGS. 6a and 6b, which show the measured transfer function and the associated phase curve.

It is also possible to use three individual feedback controllers (SISO, i.e., single-input single-output, feedback controllers) with roughly the same quality factor, which can also be referred to as "sequential loop closing."

In addition to the fine drives, the coarse drives also must be operated under feedback control; it is particularly necessary to work out the coordination of the coarse and fine drives, since the reticle carrier 1 depends directly on the fine drives, but only indirectly on the coarse drives. The position of the reticle carrier 1 here can be measured directly interferometrically, whereas the positions of the coarse drives are determined by means of added-on rotary position transducers.

A requested displacing movement means, first of all, a new setpoint for the coarse and fine drives. Both feedback control loops (both for the coarse drive and for the fine drive) try to reach the setpoint position by instituting a corrective movement. Since the fine drive responds quickly but has only a small range of travel, it soon reaches its limits. In the meantime, the coarse drive moves into the desired position at top speed. As soon as the coarse drive has moved the fine drive far enough into the desired position so that the fine drive is away from its limits, both drives perform their control functions. The coarse drive moves to its position measured by means of rotary position transducers and stays there, unaffected by the position of the fine drive. The fine drive can now bring the reticle carrier 1 into the desired position, on the basis of the interferometer data. Since disturbances always crop up in the system in the nm range, the fine controller must suppress the disturbance sufficiently to bring about the required difference in effective value. A prerequisite for this strategy is the ability to state a position sufficiently precisely both as a rotary position transducer position and as an interferometer position. For this to be possible, it is necessary, in particular, that the spindles and sleds not have any excessive linearity errors or that any such errors be compensated.

The described measurement module 8 is described as an interferometric measurement module with a specific arrangement of the measurement-beam paths. The skilled person will naturally be aware of other configurations for the interferometric measurement module that provide the requisite measurement accuracy.

The invention claimed is:

1. A device for measuring lithography masks, comprising a reticle carrier for the lithography mask to be measured,
a measurement objective for reproducing on a detector a section of said lithography mask held by said reticle carrier,
a measurement module for measuring the position of said reticle carrier relative to said measurement objective,
and a correction module by means of which said reticle carrier can be moved in order to bring it into a predetermined position relative to said measurement objective,
wherein said measurement objective and said measurement module are fastened directly to an instrument carrier in a locally fixed manner.

2. The device as in claim 1, wherein said correction module is not locally fixed directly to said instrument carrier.

3. The device as in claim 1, wherein the first eigenmode of mechanical vibration of said instrument carrier occurs at more than 100 Hz.

4. The device as in claim 1, wherein said instrument carrier is implemented in one piece.

5. The device as in claim 1, wherein said instrument carrier is formed from a single material.

6. The device as in claim 1, wherein said instrument carrier is formed from a glass ceramic material.

7. The device as in claim 1, wherein said instrument carrier is formed from an athermal material.

8. The device as in claim 1, wherein said measurement module measures the position of said reticle carrier relative to said instrument carrier in all six mutually independent degrees of freedom.

9. The device as in claim 1, wherein said measurement module measures the position of said reticle carrier interferometrically.

10. The device as in claim 1, wherein said correction module is able to adjust the position of said reticle carrier in all six mutually independent degrees of freedom.

11. The device as in claim 1, wherein said instrument carrier is mounted in a statically determinate manner.

12. The device as in claim 1, wherein said reticle carrier comprises an alternate frame that serves to receive said lithography mask and is mounted in said reticle carrier in a statically determinate manner.

13. The device as in claim 12, wherein said alternate frame can be inserted in different angular positions about an axis and can be displaced by a few mm in at least one direction in a plane perpendicular to said axis.

14. The device as in claim 13, wherein the displacement of said alternate frame with said lithography mask causes no shift in the center of gravity of said reticle carrier.

15. The device as in claim 1, wherein a measurement volume in which said reticle carrier is disposed is filled with super-clean gas or super-clean air in order to perform the measurements.

16. The device as in claim 1, wherein a measurement volume in which said reticle carrier is disposed is evacuated in order to perform the measurements.

17. A method for measuring lithography masks, wherein a reticle carrier with a lithography mask to be measured is brought into a predetermined position relative to a measurement objective, the position of said reticle carrier relative to said measurement objective is measured by means of a measurement module, and in this position a section of said reticle carrier is reproduced on a detector by means of said measurement objective, said measurement objective and said measurement module being fastened directly to an instrument carrier in a locally fixed manner.

* * * * *